(12) United States Patent
Hu et al.

(10) Patent No.: US 11,803,015 B2
(45) Date of Patent: Oct. 31, 2023

(54) OPTICAL PROBE FOR OPTOELECTRONIC INTEGRATED CIRCUITS

(71) Applicant: FOCI FIBER OPTIC COMMUNICATIONS, INC., Hsinchu (TW)

(72) Inventors: Ting-Ta Hu, Hsinchu (TW); Hsu-Liang Hsiao, Hsinchu (TW); Po-Yi Wu, Hsinchu (TW)

(73) Assignee: FOCI FIBER OPTIC COMMUNICATIONS, INC., Hsinchu (TW)

( * ) Notice: Subject to any disclaimer, the term of this patent is extended or adjusted under 35 U.S.C. 154(b) by 0 days.

(21) Appl. No.: 17/838,291

(22) Filed: Jun. 13, 2022

(65) Prior Publication Data

US 2023/0314721 A1   Oct. 5, 2023

(30) Foreign Application Priority Data

Mar. 31, 2022 (TW) ................. 111203306

(51) Int. Cl.
*G02B 6/36* (2006.01)
*G01R 1/07* (2006.01)

(52) U.S. Cl.
CPC ........... *G02B 6/3624* (2013.01); *G01R 1/071* (2013.01)

(58) Field of Classification Search
CPC ...... G02B 6/2852; G02B 6/30; G02B 6/3624; G01M 11/35
See application file for complete search history.

(56) References Cited

U.S. PATENT DOCUMENTS

| 6,909,830 B2* | 6/2005 | Lee ........................ G01M 11/35 385/125 |
| 7,236,665 B2* | 6/2007 | Kobayashi ........... G02B 6/3644 385/119 |

FOREIGN PATENT DOCUMENTS

CN    113568102 A  * 10/2021

* cited by examiner

*Primary Examiner* — Omar R Rojas
(74) *Attorney, Agent, or Firm* — LIN & ASSOCIATES INTELLECTUAL PROPERTY, INC.

(57) ABSTRACT

An optical probe for optoelectronic integrated circuits is provided, applicable to a test environment for testing a plurality of optical chips on a wafer. The optical chips include at least one optical waveguide, and the optical probe includes a substrate and an optical fiber. The facet of the optical fiber has a first angle, and the first angle causes the optical signal transmitted by the optical fiber to generate total reflection, and the optical signal after total reflection enters the optical waveguide of the optical chip. Thereby, an optical probe able to perform testing before wafer cutting and polishing is provided, and a high-speed, effective and reliable detection is achieved.

8 Claims, 12 Drawing Sheets

OPTICAL PROBE FOR OPTOELECTRONIC INTEGRATED CIRCUITS

BACKGROUND OF THE INVENTION

1. Field of the Invention

The present invention relates generally to an optical probe for optoelectronic integrated circuits, and more particularly, to an optical probe applicable to a wafer including a plurality of optical chips integrally before cutting.

2. The Prior Arts

Flat optical elements are optical elements based on optical waveguide technology, which are fabricated on various types of flat substrates. Optical chips based on the optical waveguide technology contain three types of components, namely, passive, active and electronic components, wherein the passive components include single components such as optical waveguides, directional couplers, Mach-Lendl interferometers, ring resonators, etc., or a planar optoelectronic integrated circuit composed of various components and functions. These optical chips are fabricated on flat substrates. Typically, individual wafers are batch fabricated on semiconductor wafers made of, for example, Si or InP. These wafers go through various fabrication steps, such as material deposition and etching, often involving photolithography, to form discrete optical components in or on top of the substrate material.

In the prior art, the detection of wafer-level planar optical components is usually achieved by surface light coupling, which couples the light into the wafer and passes through an optical integrated circuit, and then guides the light for optical detection, or by performing standard on-wafer electronic testing using electrical connections to the wafer. However, in order to achieve surface light coupling, a grating structure must be fabricated on the coupling surface of the planar optical element, and an optical fiber array connector should be used to align the light coupling. However, it is difficult to improve the coupling efficiency of the grating structure, which makes the breakthroughs difficult in the above-mentioned prior art. And in terms of the accuracy of the alignment angle, the optical fiber of the grating coupling method should not only maintain a certain distance from the grating in the horizontal direction, but also ensure a certain height in the vertical direction, which requires a special structure designed to ensure the vertical coupling accuracy, resulting in a substantial increase in cost and size of the test element.

In the prior art, another detection method is to use a wafer foundry to manufacture an end-coupling integrated optical element, so as to detect through an optical fiber after the wafer is cut and polished. However, this detection method is costly and time-consuming. In addition, this approach is unable to analyze the device process yield and improve the process at a earlier time, which is easy to generate additional manufacturing costs as well as the product development cycle. In addition, if manual coupling is used in the testing of wafer-level planar optical components, the structures able to be tested will be greatly limited, and the testing efficiency will also be low. If wafers are to be mass-produced, a high-speed, efficient, and reliable inspection solution must be implemented.

In view of the above shortcomings, the present invention is developed.

SUMMARY OF THE INVENTION

A primary objective of the present invention is to provide an optical probe for optoelectronic integrated circuits, applicable to a test environment wherein an uncut wafer is integrally formed with a plurality of optical chips, wherein the bottom of the optical fiber of the optical probe is provided with a facet having a first angle to cause total reflection of the optical signal transmitted by the optical fiber. The optical signal after total reflection enters the optical waveguide of the optical chip through a microlens, and the optical signal is coupled to the optical chip on the wafer through the facet. As such, an optical probe able to test before wafer cutting and polishing is provided, so as to realize analyzing the component process yield at the earliest time to improve the process, reduce the extra production cost and product development cycle, and improve the detection accuracy and convenience of the end-face light coupling, achieving both wide applicability and high accuracy.

Another objective of the present invention is to provide an optical probe for optoelectronic integrated circuits, wherein the optical probe further includes a positioning block, and the shape of the positioning block corresponds to the grooves of the optical chips. As such, the accuracy of vertical coupling is ensured, thereby improving the coupling efficiency of the optical fiber and the optical waveguide, improving the alignment accuracy and reducing the allowable tolerance.

In order to achieve the above objectives and effects, the present invention provides an optical probe for optoelectronic integrated circuits, applicable to a test environment for testing a plurality of optical chips on a wafer, and the optical chips include at least one light waveguide, the optical probe includes: a substrate; a plurality of optical fibers, arranged on the substrate, the optical fibers being used for transmitting an optical signal transmitted in a first direction, and a light-emitting end of the optical fiber having a facet, and a first angle formed between the facet and the first direction; wherein, the first angle causes the optical signal transmitted by the optical fiber to generate total reflection and output along a second direction, and the optical signal after total reflection enters the optical waveguide of the optical chips, and the first angle is between 40 degrees and 45 degrees.

Preferably, the optical probe of the present invention further includes a lens layer, disposed on the optical fibers, the lens layer includes a plurality of first microlenses, and each of the first microlenses corresponds to each of the optical fibers, the first microlenses focus the optical signal after total reflection from the facet, so that the optical signal after total reflection is focused into the optical waveguide of the optical chips through the first microlenses.

Preferably, according to the optical probe of the present invention, the optical fibers include a film layer and a core portion, the film layer wraps around the core portion, and one end of the core portion forms a second angle with the first direction, the optical signal is transmitted inside the core portion, and the second angle is between 2 degrees and 10 degrees.

Preferably, according to the optical probe of the present invention, the optical chips have a groove, and the groove is a wafer dicing line, into which the optical probe is inserted along the first direction, so that the optical probe is coupled to the optical chips of the wafer.

Preferably, according to the optical probe of the present invention, the optical probe further includes a positioning block, disposed on the lens layer, and having a shape matching the groove.

Preferably, the optical probe of the present invention further comprises a plurality of second microlenses, disposed on the optical fibers by means of three-dimensional printing, each of the second microlenses corresponding to each of the optical fibers, the second microlenses focusing the optical signal after total reflection from the facet, so that the optical signal after total reflection focuses the light entering the optical chip through the second microlenses waveguide.

Preferably, according to the optical probe of the present invention, the substrate includes a plurality of v-grooves, and each of the optical fibers is correspondingly confined within each of the v-grooves.

Preferably, the optical probe according to the present invention further includes a fixing cover, disposed on the substrate, and the fixing cover being used for fixing the optical fibers to be confined in the v-grooves.

In summary, the optical probe of the optoelectronic integrated circuit provided by the present invention is provided with a facet through the bottom end of the optical fiber, and the facet has a first angle to cause total reflection of the optical signal transmitted by the optical fiber. As such, an optical probe able to test before wafer cutting and polishing is provided, so as to realize analyzing the component process yield at the earliest time to improve the process, reduce the extra production cost and product development cycle, and improve the detection accuracy and convenience of the end-face light coupling, achieving both wide applicability and high accuracy. In addition, the optical probe provided by the present invention may further include a positioning block, the shape of the positioning block is corresponding to the grooves of the optical chips, and the positioning block and the groove are detachable assembly structure. As such, the accuracy of vertical coupling is ensured, thereby improving the coupling efficiency of the optical fiber and the optical waveguide, improving the alignment accuracy and reducing the allowable tolerance.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

The inventive concept will be explained more fully hereinafter with reference to the accompanying drawings in which exemplary embodiments of the inventive concept are shown. Advantages and features of the inventive concept and methods for achieving the same will be apparent from the following exemplary embodiments, which are set forth in more details with reference to the accompanying drawings. However, it should be noted that the present inventive concept is not limited to the following exemplary embodiments, but may be implemented in various forms. Accordingly, the exemplary embodiments are provided merely to disclose the inventive concept and to familiarize those skilled in the art with the type of the inventive concept. In the drawings, exemplary embodiments of the inventive concepts are not limited to the specific examples provided herein and are exaggerated for clarity.

The terminology used herein is used to describe particular embodiments only, and is not intended to limit the present invention. As used herein, the singular terms "a" and "the" are intended to include the plural forms as well, unless the context clearly dictates otherwise. As used herein, the term "and/or" includes any and all combinations of one or more of the associated listed items. It will be understood that when an element is referred to as being "connected" or "coupled" to another element, it can be directly connected or coupled to the other element or intervening elements may be present.

Similarly, it will be understood that when an element (e.g., a layer, region, or substrate) is referred to as being "on" another element, it can be directly on the other element or intervening elements may be present. In contrast, the term "directly" means that no intervening elements are present. It should be further understood that when the terms "comprising" and "including" are used herein, it is intended to indicate the presence of stated features, steps, operations, elements, and/or components, but does not exclude one or more other features, steps, operations, elements, components, and/or the presence or addition of groups thereof.

Furthermore, exemplary embodiments in the detailed description are set forth in cross-section illustrations that are idealized exemplary illustrations of the present inventive concepts. Accordingly, the shapes of the exemplary figures may be modified according to manufacturing techniques and/or tolerable errors. Therefore, the exemplary embodiments of the present inventive concept are not limited to the specific shapes shown in the exemplary figures, but may include other shapes that may be produced according to the manufacturing process. The regions illustrated in the figures have general characteristics and are used to illustrate specific shapes of elements. Therefore, this should not be considered limited to the scope of this creative concept.

It will also be understood that, although the terms "first," "second," "third," etc. may be used herein to describe various elements, these elements should not be limited by these terms. These terms are only used to distinguish each element. Thus, a first element in some embodiments could be termed a second element in other embodiments without departing from the teachings of the present creation. Exemplary embodiments of aspects of the present inventive concept illustrated and described herein include their complementary counterparts. Throughout this specification, the same reference numbers or the same designators refer to the same elements.

Furthermore, example embodiments are described herein with reference to cross-sectional and/or planar views, which are illustrations of idealized example illustrations. Accordingly, deviations from the shapes shown, for example, caused by manufacturing techniques and/or tolerances, are expected. Accordingly, the exemplary embodiments should not be considered limited to the shapes of the regions shown herein, but are intended to include deviations in shapes resulting from, for example, manufacturing. Thus, the regions illustrated in the figures are schematic and their shapes are not intended to illustrate the actual shape of a region of a device and are not intended to limit the scope of example embodiments.

Figure 1:
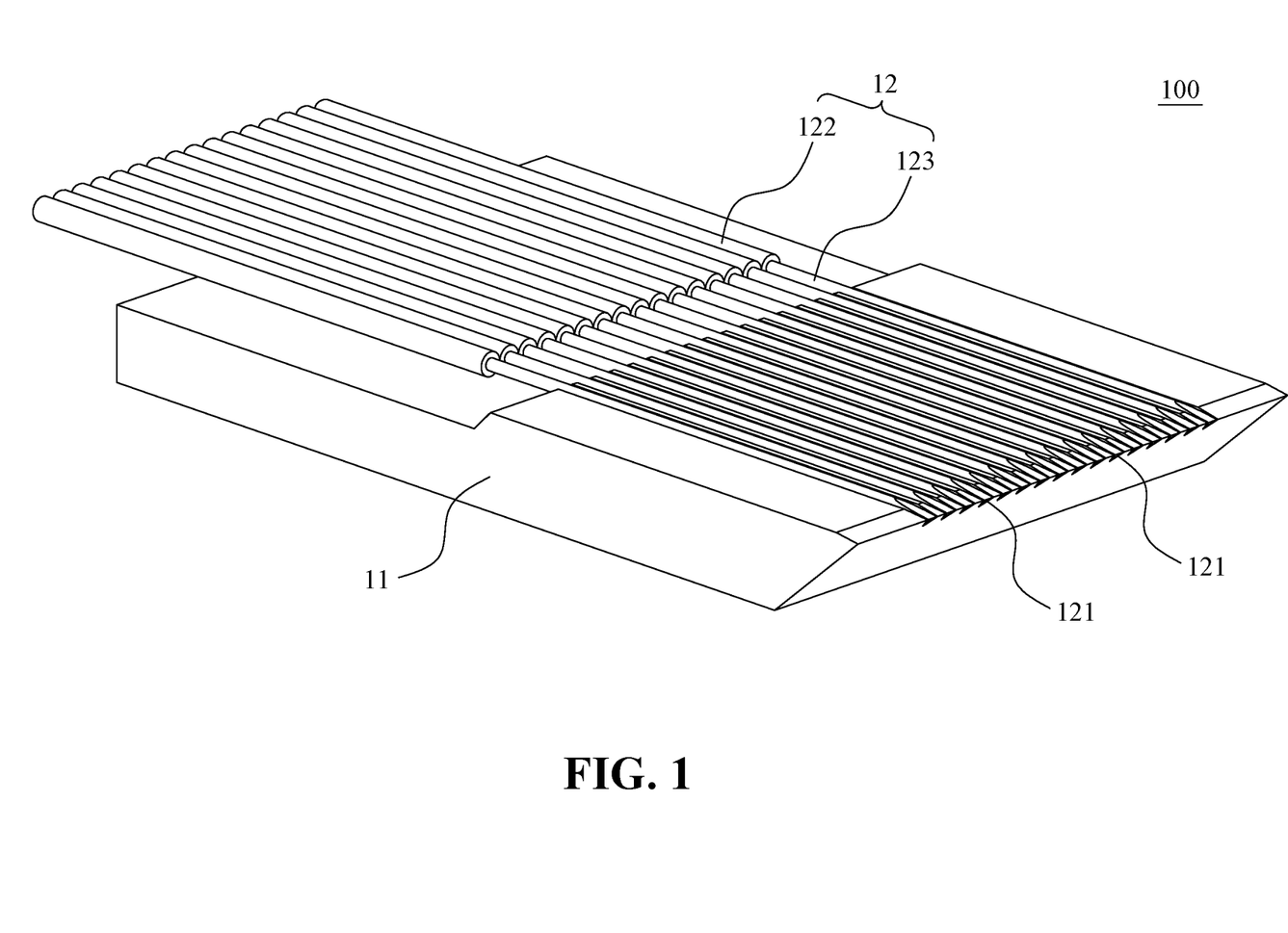
FIG. 1 is a schematic view of an optical probe for optoelectronic integrated circuits according to the present invention.
Figure 2:
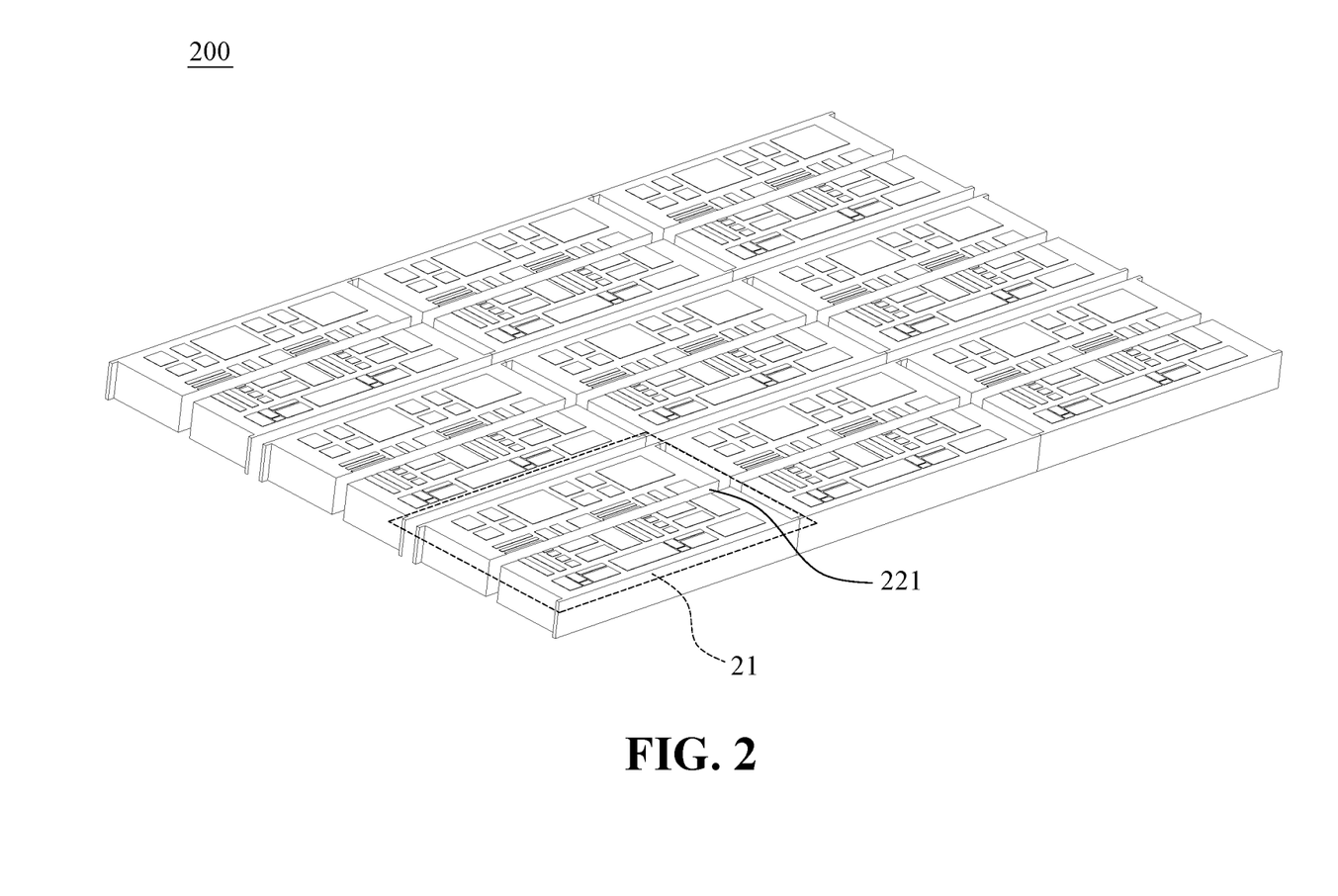
FIG. 2 is a schematic view of a wafer according to the present invention.
Figure 3:
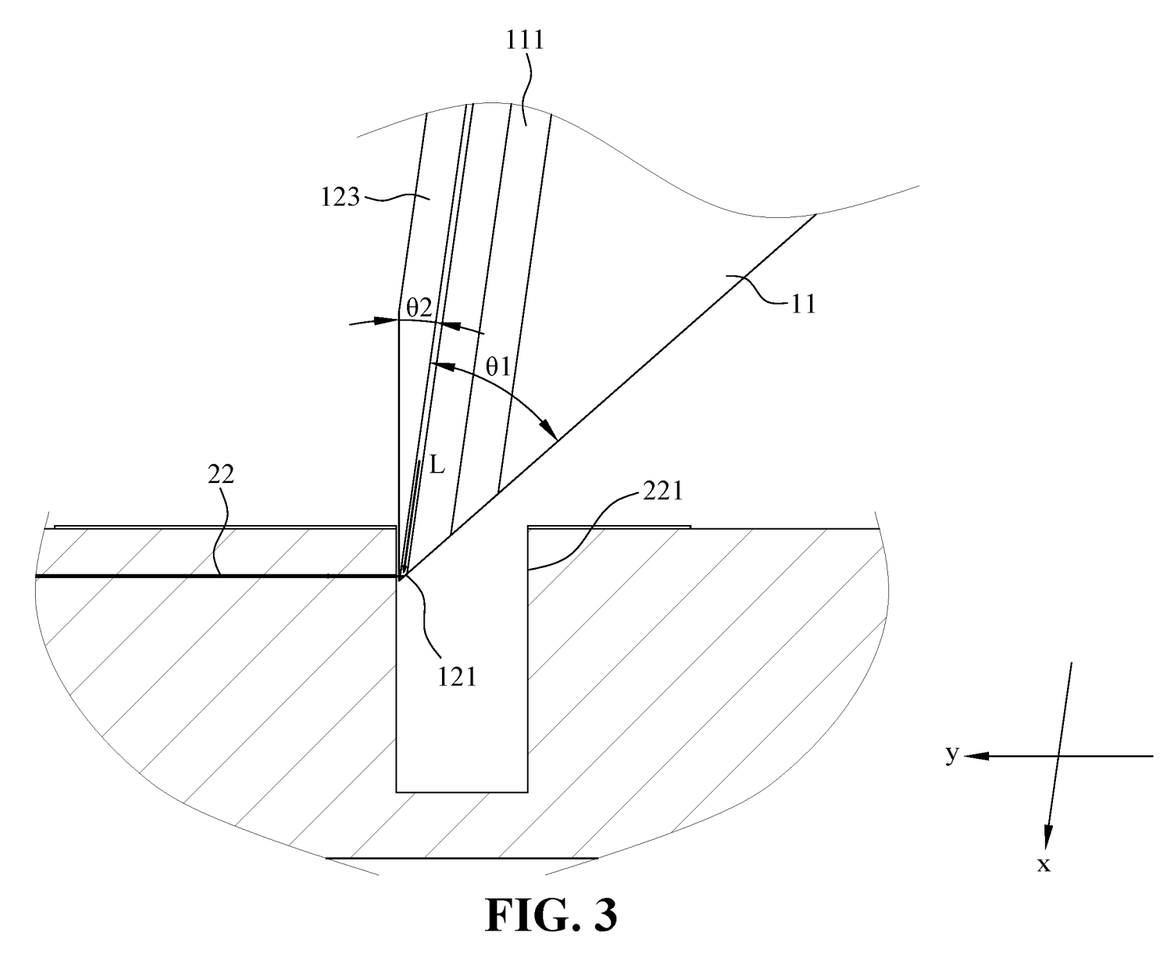
FIG. 3 is a schematic view illustrating the end-face coupling of the optical probe and the optical waveguide according to the present invention.

Refer to FIGS. 1-3, FIG. FIG. 1 is a schematic view of an optical probe for optoelectronic integrated circuits according to the present invention; FIG. 2 is a schematic view of a wafer according to the present invention; FIG. 3 is a schematic view illustrating the end-face coupling of the optical probe and the optical waveguide according to the present invention. As shown in FIG. 1, the optical probe 100 for optoelectronic integrated circuits according to the present invention is applied in a test environment for testing a plurality of optical chips 21 on a wafer 200. The optical probe 100 includes a substrate 11 and an optical fiber 12.

Specifically, refer to FIG. 2. the test wafer 200 includes a plurality of optical chips 21, and the optical chips 21 include optical waveguides 22. In the present embodiment, the structures of the optical waveguide 22 may be a waveguide, a ridge waveguide, etc. The optical waveguide 22 is mainly used to help transmit optical signals. In addition, as shown in FIG. 3, the optical chip 21 further includes grooves 221. The grooves 221 are wafer dicing lines, and the optical probes can be inserted into the grooves 221, so that the optical probes 100 are coupled to the optical chip 21 on wafer 200. In some embodiments, the groove 221 can be formed by etching or physical removal, for example, a shallow slice that does not penetrate the bottom of the wafer 200. For example, the grooves 221 of the wafer 200 of the present invention can be created by laser ablation, but the present invention is not limited thereto.

Specifically, refer to FIG. 3. The optical fiber 12 of the present invention is disposed on the substrate 11, and the optical fiber 12 is used for transmitting the optical signal L transmitted along the first direction x. In the present embodiment, a facet 121 is provided at the light exit end of the optical fiber 12, and a first angle θ1 is formed between the facet 121 and the first direction x, wherein the first angle θ1 is mainly used to make the optical signal L transmitted to the facet 121 reflected totally. After the optical signal L transmitted to the facet 121 generates total reflection, the optical signal L after the total reflection is transmitted along the second direction y and exits out of the optical fiber 12. Specifically, in some embodiments, the optical fiber 12 must be cut with a precise bevel angle, the facet 121 can be formed by polishing the end of the optical probe 100, and the first angle θ1 is about 45 degrees; however, the present invention is not limited thereto. It should be further explained that, if the change in the transmission direction of the optical signal L caused by the first angle θ1 of the facet 121 is sufficient for the application, for example, if the change in the transmission direction of the optical signal L is sufficient to achieve acceptable coupling loss between the optical probe 100 and the optical waveguide 22, the first angle θ1 may be between 40 degrees and 45 degrees. In other embodiments, the facets 121 may be covered with a dielectric mirror stack configured to provide reflection for the wavelength of the optical signal L. It is worth noting again that the facet 121 can also be used without any coating if the reflectivity on the facet 121 is sufficient to deflect the light signal L in the desired direction. It is worth noting that the facet 121 may also be a curved shape instead of a straight shape. In other embodiments, the facet 121 can be set in a curved shape, and the curved facet 121 can further provide functions such as focusing or collimation. Users can choose which method is more appropriate according to their needs. The present invention should not be interpreted as limited thereto only.

Specifically, in some embodiments, the optical fiber 12 includes a film layer 122 and a core portion 123, wherein the film layer 122 wraps around and covers the core portion 123, and one end of the core portion 123 forms the second angle θ2 with the first direction x. The optical signal L is transmitted in the core portion 123. When the optical signal L is transmitted to the facet 121, the transmission direction is changed to enter the optical waveguide 22 of the optical chip 21. Specifically, the second angle θ2 is less than 10 degrees, and more specifically, the second angle θ2 is between 2 degrees and 10 degrees. It should be further noted that the second angle θ2 is mainly used to prevent the downward leakage of the optical signal L transmitted by the core portion 123, and can also prevent the reflection from occurring when the optical chip 21 is tested, thereby achieving the purpose of reducing light loss.

It should be further explained that, in some embodiments, when the optical probe 100 performs testing on the plurality of optical chips 21 on the wafer 200, the optical fiber 12 of the optical probe 100 is close to the grooves 221 of the optical waveguide 22 of the optical chip 21, the fiber 12 vertically couples out the optical signal L, and generates total reflection through the facet 121 at the bottom of the optical fiber 12, so that the optical signal L is converted from vertical transmission into the optical waveguide 22. As far as the accuracy of the alignment angle is concerned, the way of connecting the optical probe 100 and the wafer 200 at right angles is more accurate in coupling accuracy than other angles, which greatly improves the stability and reliability of the present invention. However, the present invention is not limited thereto.

Hereinafter, with reference to the drawings, the first implementation of the optical probe 100 of the present invention will be described, so that those with ordinary knowledge in the technical field to which the present invention belongs can more clearly understand possible changes. Elements designated with the same reference numerals as above are substantially the same as those described above with reference to FIGS. 1-3. The same elements, features, and advantages as the optical probe 100 will not be repeated.

Figure 4:
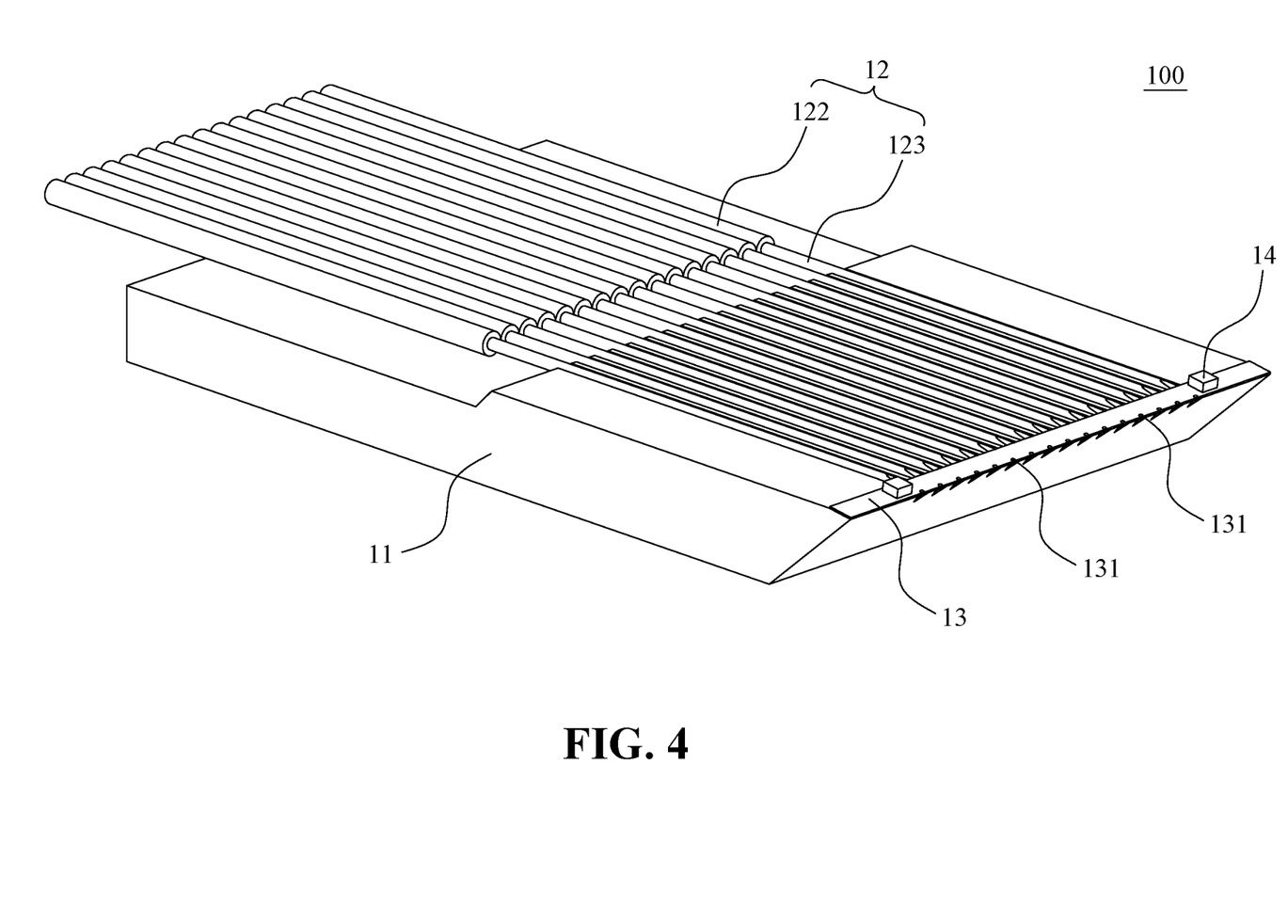
FIG. 4 is a schematic view of an optical probe for optoelectronic integrated circuits according to the first embodiment of the present invention.
Figure 5:
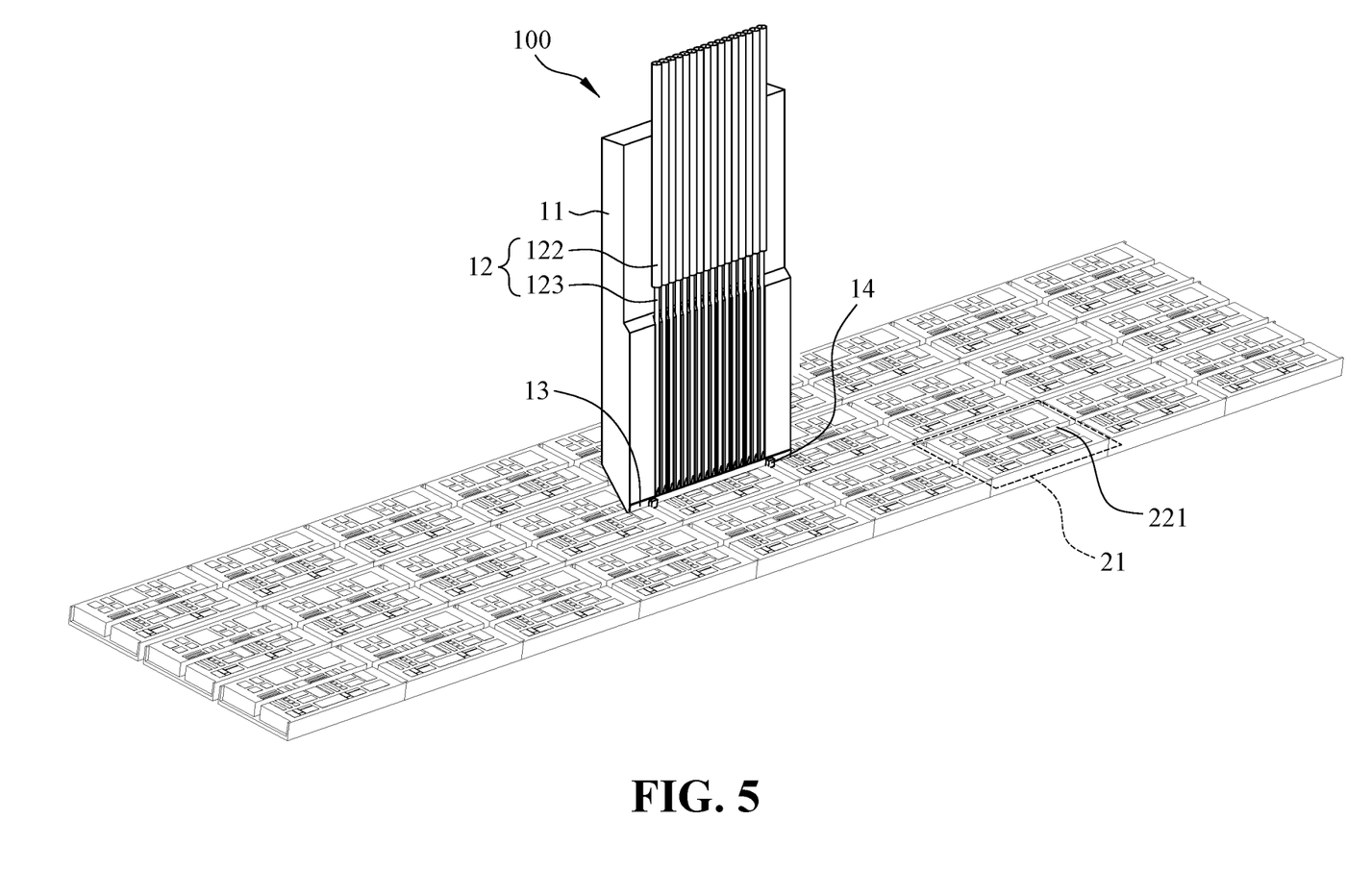
FIG. 5 is a top view illustrating the end-face coupling of the optical probe and the optical waveguide according to the first embodiment of the present invention.
Figure 6:
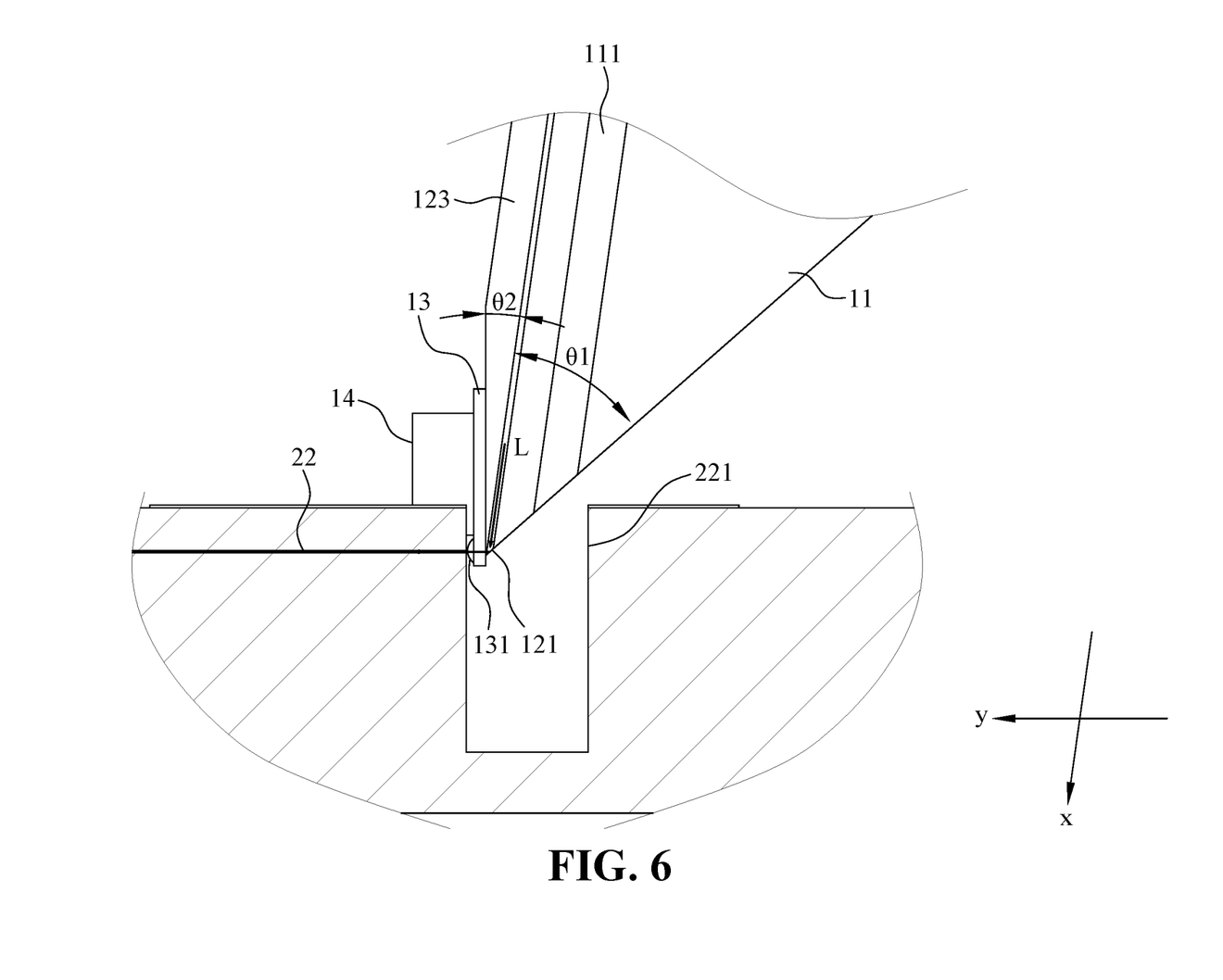
FIG. 6 is a schematic view illustrating the end-face coupling of the optical probe and the optical waveguide according to the first embodiment of the present invention.

Refer to FIGS. 4-6. FIG. 4 is a schematic view of an optical probe for optoelectronic integrated circuits according to the first embodiment of the present invention; FIG. 5 is a top view illustrating the end-face coupling of the optical probe and the optical waveguide according to the first embodiment of the present invention; FIG. 6 is a schematic view illustrating the end-face coupling of the optical probe and the optical waveguide according to the first embodiment of the present invention. As shown in FIG. 4, the optical probe 100 for optoelectronic integrated circuits according to the present invention includes: a substrate 11, an optical fiber 12, a lens layer 13, and a positioning block 14.

Specifically, refer to FIGS. 4-6. The optical probe 100 of the first embodiment of the present invention further includes a lens layer 13, the lens layer 13 is disposed on the optical fiber 12, the lens layer 13 includes plurality of first microlenses 131, and each of the first microlenses 131 corresponds to each of the corresponding optical fibers 12. In the present embodiment, the first microlenses 131 may be formed by hardening an optically transparent material, and the optically transparent material may be an index matching oil matched with the optical waveguide 22. The lens layer 13 is disposed between the optical probe 100 and the plurality of optical waveguides 22 to reduce the transmission loss of the optical signal L between the optical fiber 12 and the optical waveguide 22. More specifically, the first microlenses 131 are mainly used to reduce the loss between the optical fiber 12 and the optical waveguide 22. Because the refractive indexes of the air, glass and the material of the optical chip 21 are different, so that when the optical signal L is transmitted to different interfaces, strong reflection is generated. Therefore, by filling with materials with a refractive index closer to the two, such as silicon, glass or liquid (i.e., refractive index matching glue) after aligning the optical fiber 12 and the optical waveguide 22, followed by curing of the optically transparent material with UV light at a specific temperature, the transmission and coupling loss is further reduced. More specifically, the first microlens 131 can also focus or collimate the optical signal L into the optical waveguide 22, thereby reducing the coupling loss, but the present invention is not limited thereto.

Specifically, as shown in FIGS. 4-6, the optical probe 100 according to the first embodiment of the present invention further includes a positioning block 14, and the positioning block 14 is disposed on the lens layer 13. The shape of the block 14 matches with the groove 221, and the positioning block 14 is mainly used for correcting and aligning the placement position before testing. As shown in FIG. 4, the positioning block 14 is disposed above the substrate 11 in an area outside the optical fibers 12 so as not to overlap or interfere with the optical fibers 12. As such, the optical probe 100 of the first embodiment of the present invention can ensure the angle and position of the optical probe 100 when testing the optical chip 21 on the wafer 200 through the setting of the positioning block 14, and further ensure the accuracy of vertical coupling, thereby improving the coupling efficiency between the optical fiber 12 and the optical waveguide 22, improving the alignment accuracy and detection efficiency, and reducing the allowable tolerance and calibration alignment time.

Other examples of the optical probe 100 are provided below to make possible variations more clearly understood by those of ordinary skill in the art to which the present invention pertains. Elements denoted by the same reference numerals as those of the above-described embodiments are substantially the same as those described above with reference to FIGS. 1 and 4. The same elements, features, and advantages as the optical probe 100 will not be repeated.

Figure 7:
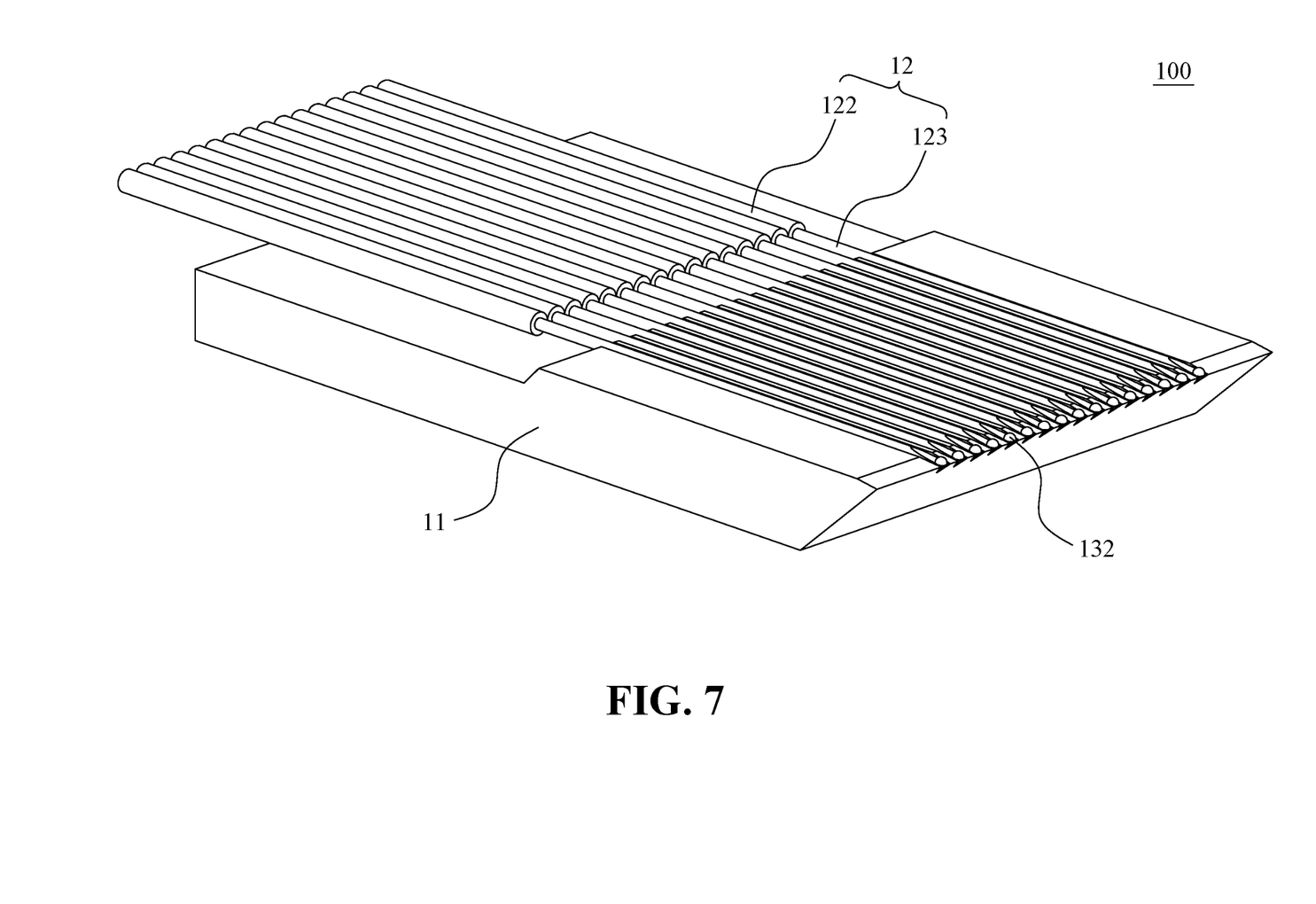
FIG. 7 is a schematic view of an optical probe for optoelectronic integrated circuits according to a second embodiment of the present invention.

Refer to FIG. 7, which is a schematic view of an optical probe for optoelectronic integrated circuits according to a second embodiment of the present invention. As shown in FIG. 7, in the present embodiment, the optical probe 100 further includes second microlenses 132, and the second microlenses 132 are disposed on the optical fiber 12 by three-dimensional printing. Each of the microlenses 132 corresponds to each of the optical fibers 12, and the second microlenses 132 are used to focus the optical signal L totally reflected from the facet 121. Specifically, in the present embodiment, the second microlens 132 is made of a material suitable for three-dimensional printing. For example, the material is, but not limited to, thermoplastic elastomer, transparent thermoplastic elastomer, or other similar materials. Compared with the first embodiment, the optical probe for optoelectronic integrated circuits of the second embodiment precisely disposes the second microlens 132 on each of the optical fibers 12 by means of three-dimensional printing, so that no additional lens layer 13 is provided, so as to achieve the effect of reducing the size and cost of the optical probe 100.

Figure 8:
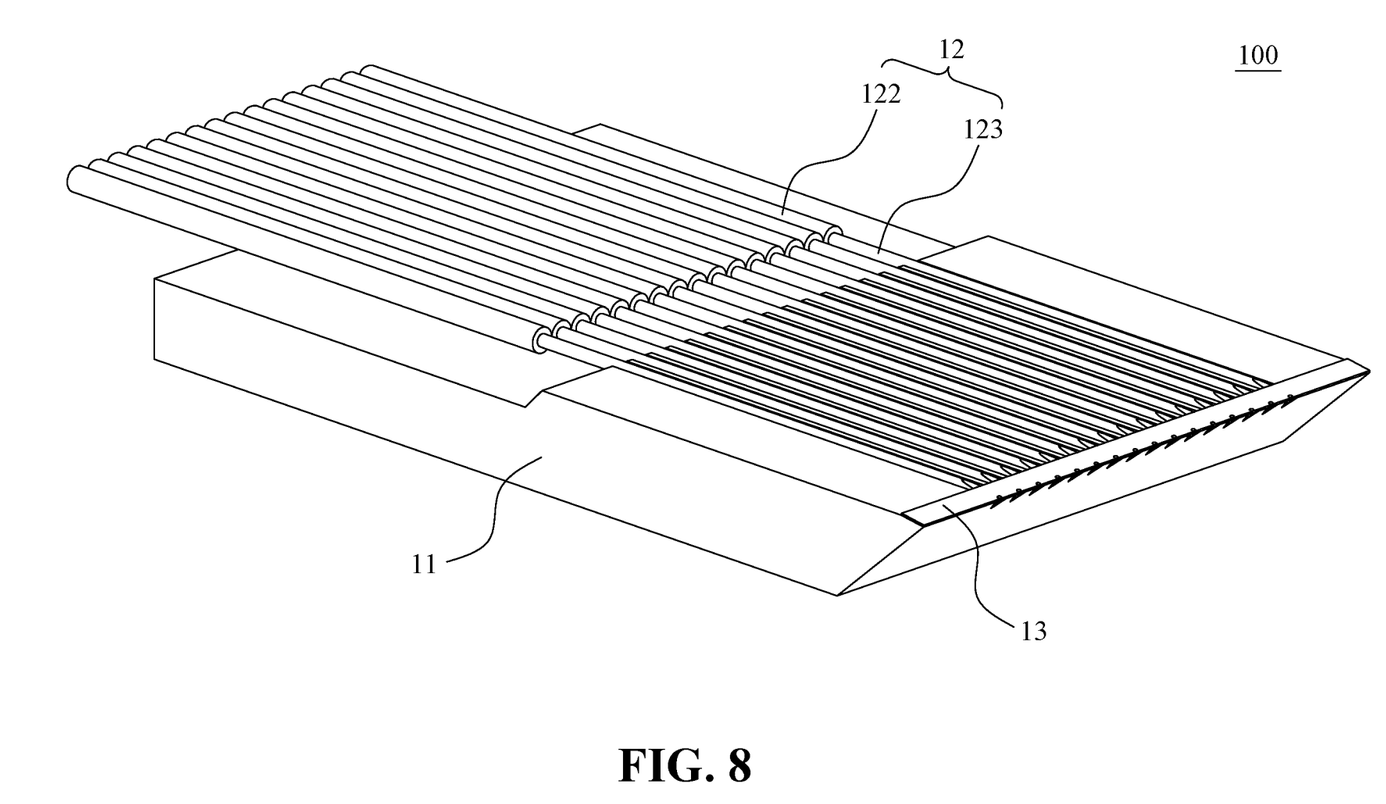
FIG. 8 is a schematic view of an optical probe for optoelectronic integrated circuits according to a third embodiment of the present invention.

Refer to FIG. 8, which is a schematic view of an optical probe for optoelectronic integrated circuits according to a third embodiment of the present invention. As shown in FIG. 8, compared with the first embodiment, the optical probe 100 in the third embodiment of the present invention is not provided with the positioning block 14, thereby reducing the manufacturing cost and volume of the optical probe 100. The materials and other characteristics of the optical probe 100 in the third embodiment are similar to those of the first embodiment, and are not repeated here.

Figure 9:
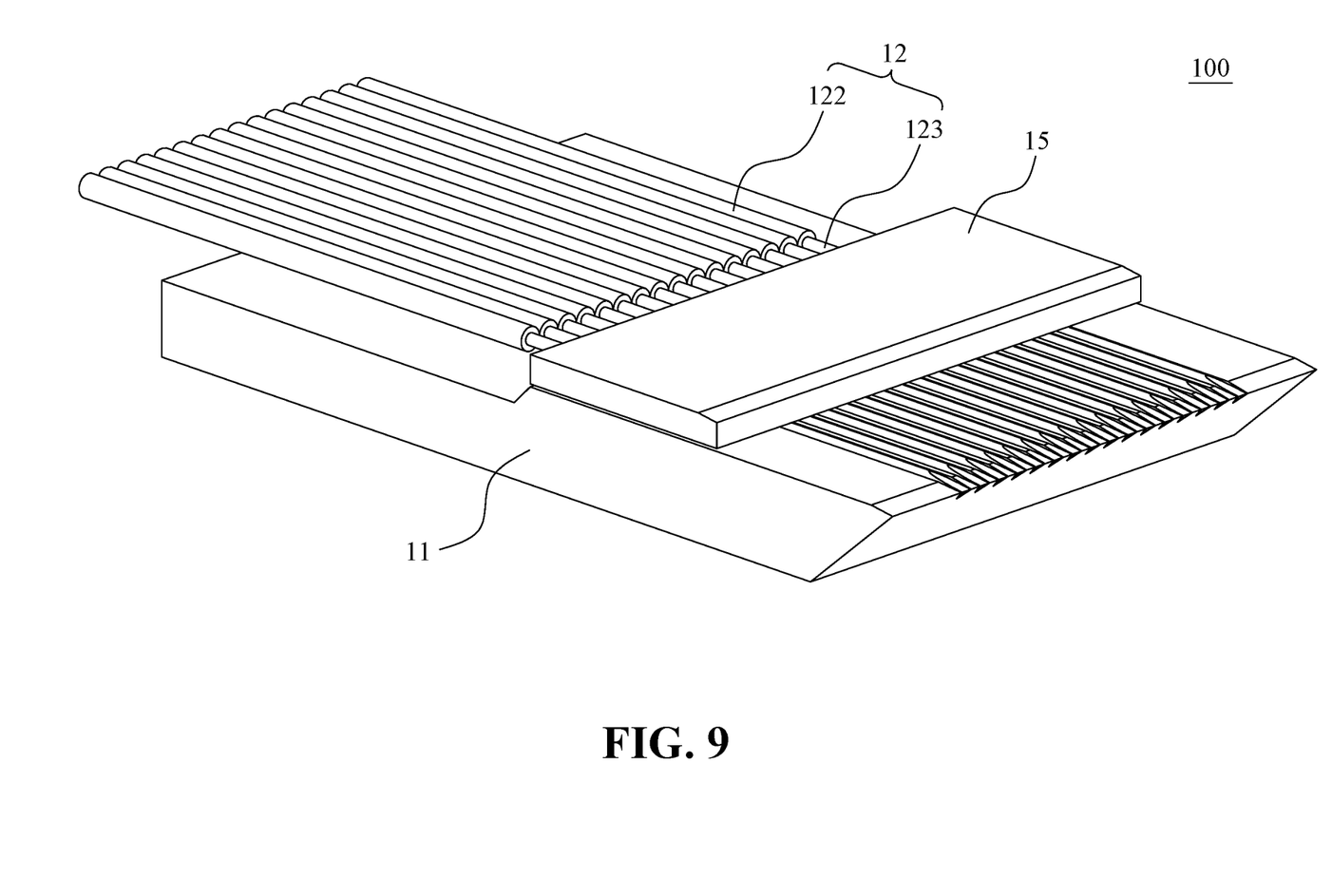
FIG. 9 is a schematic view of an optical probe for optoelectronic integrated circuits according to a fourth embodiment of the present invention.
Figure 10:
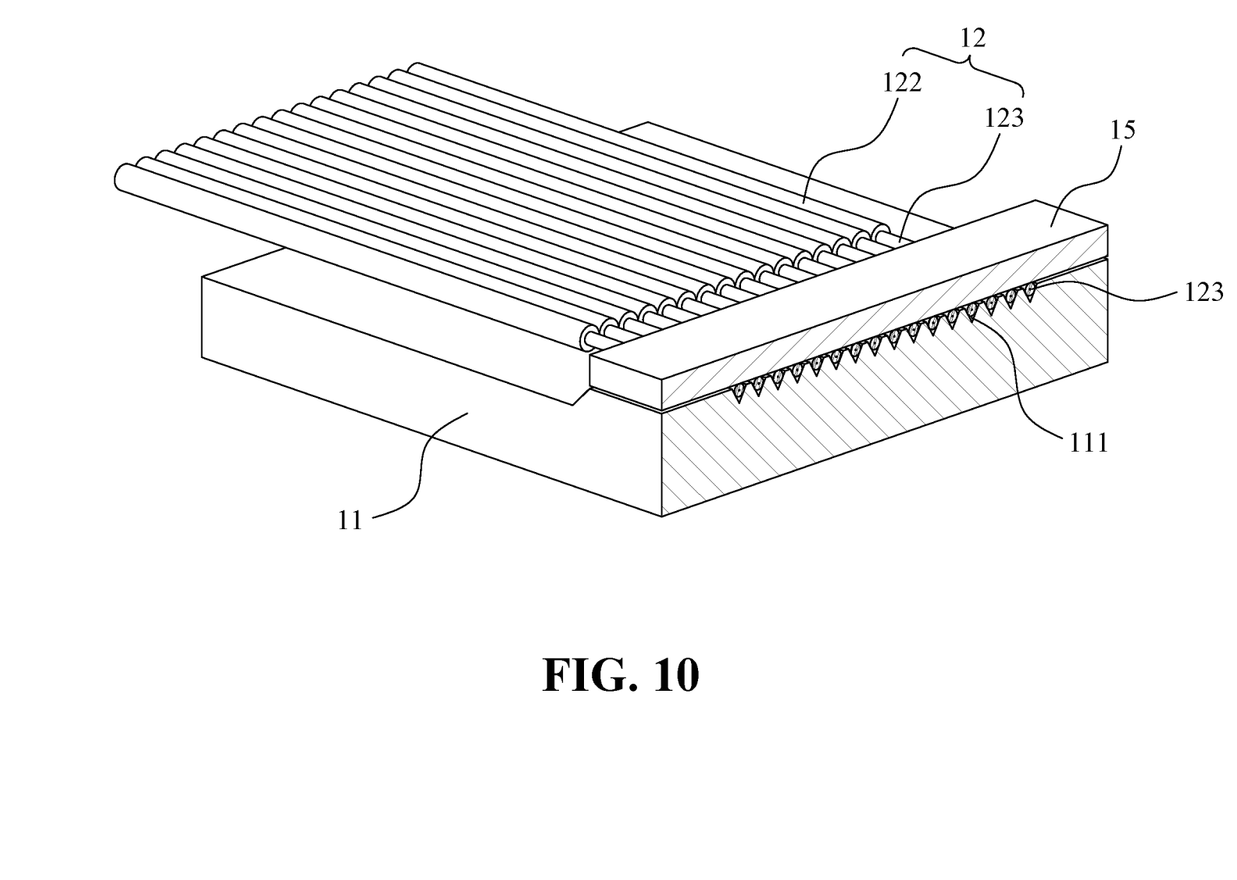
FIG. 10 is a cross-sectional view of an optical probe for optoelectronic integrated circuits according to the fourth embodiment of the present invention.

Refer to FIGS. 9-10. FIG. 9 is a schematic view of an optical probe for optoelectronic integrated circuits according to a fourth embodiment of the present invention; FIG. 10 is a cross-sectional view of an optical probe for optoelectronic integrated circuits according to the fourth embodiment of the present invention. As shown in FIGS. 9-10, in the present embodiment, the substrate 11 includes a plurality of v-grooves 111, i.e., v-shaped grooves, and the v-grooves 111 are used to limit the position of the core portion 123 of the optical fibers 12 to confine the optical fibers within each of the corresponding v-grooves 111. Moreover, the optical probe 100 of the fourth embodiment of the present invention further includes a fixing cover 15, the fixing cover 15 is disposed on the substrate 11, and the fixing cover 15 is used for fixing the optical fibers 12 so that the optical fibers 12 are limited to the v-grooves 111; however, the present invention is not limited thereto.

Thereby, the optical probe 100 of the optoelectronic integrated circuit of the fourth embodiment of the present invention further fixes and stabilizes the optical fibers 12 within the v-grooves 111 through the disposition of the v-grooves 111 and the fixing cover 15 on the substrate 11, the stability of the optical probe 100 is improved, and a high-speed, effective and reliable detection solution is achieved.

Figure 11:
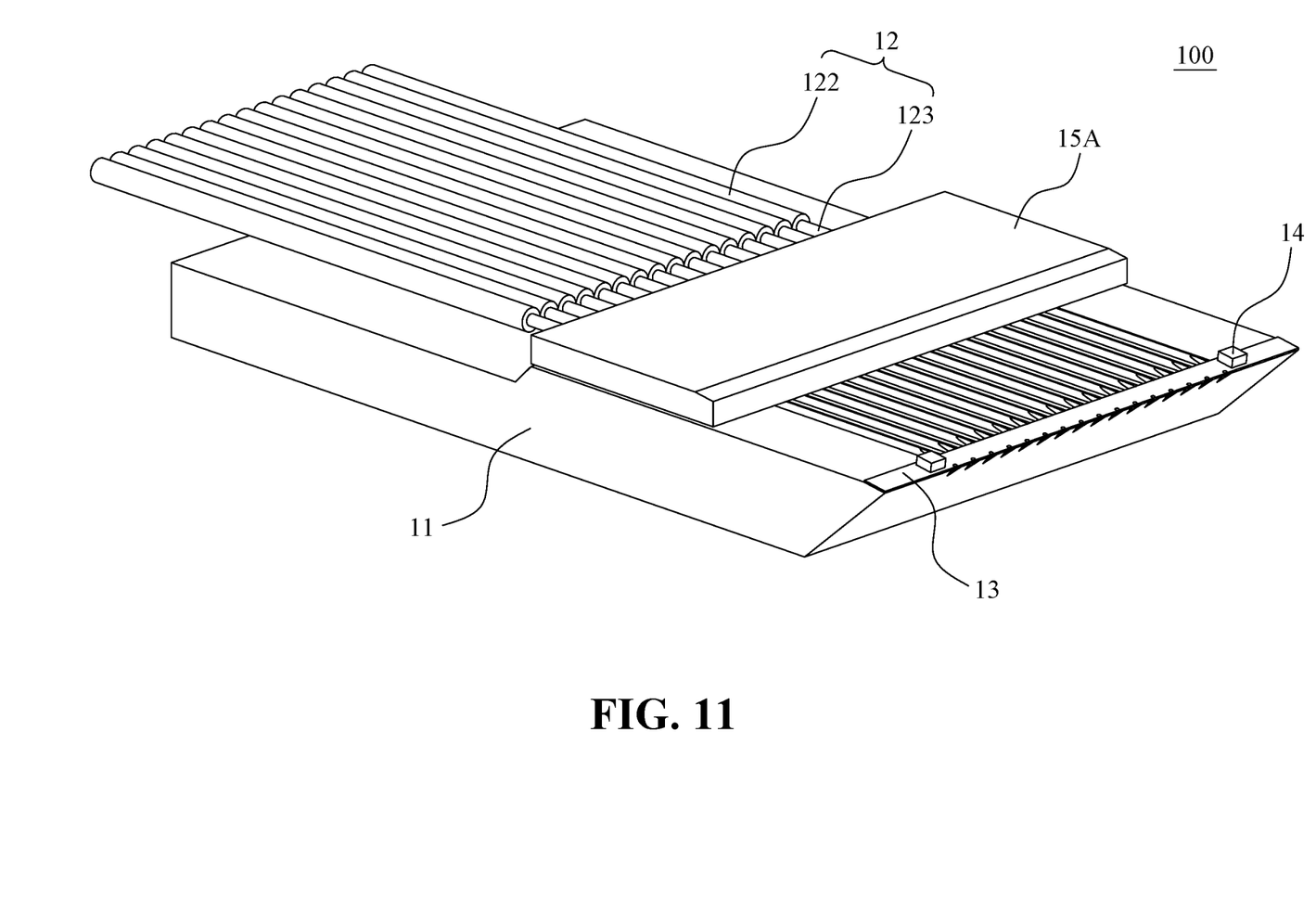
FIG. 11 is a schematic view of an optical probe for optoelectronic integrated circuits according to a fifth embodiment of the present invention.

FIG. 11 is a schematic view of an optical probe for optoelectronic integrated circuits according to a fifth embodiment of the present invention. Compared with the first embodiment, the optical probe 100 in the fifth embodiment of the present invention further includes a fixing cover 15A. The fixing cover 15A is disposed on the substrate 11, and the fixing cover 15A is used for fixing the optical fibers 12. The materials and other characteristics used for the fixing cover 15A are similar to the fixing cover 15 and will not be repeated here.

Figure 12:
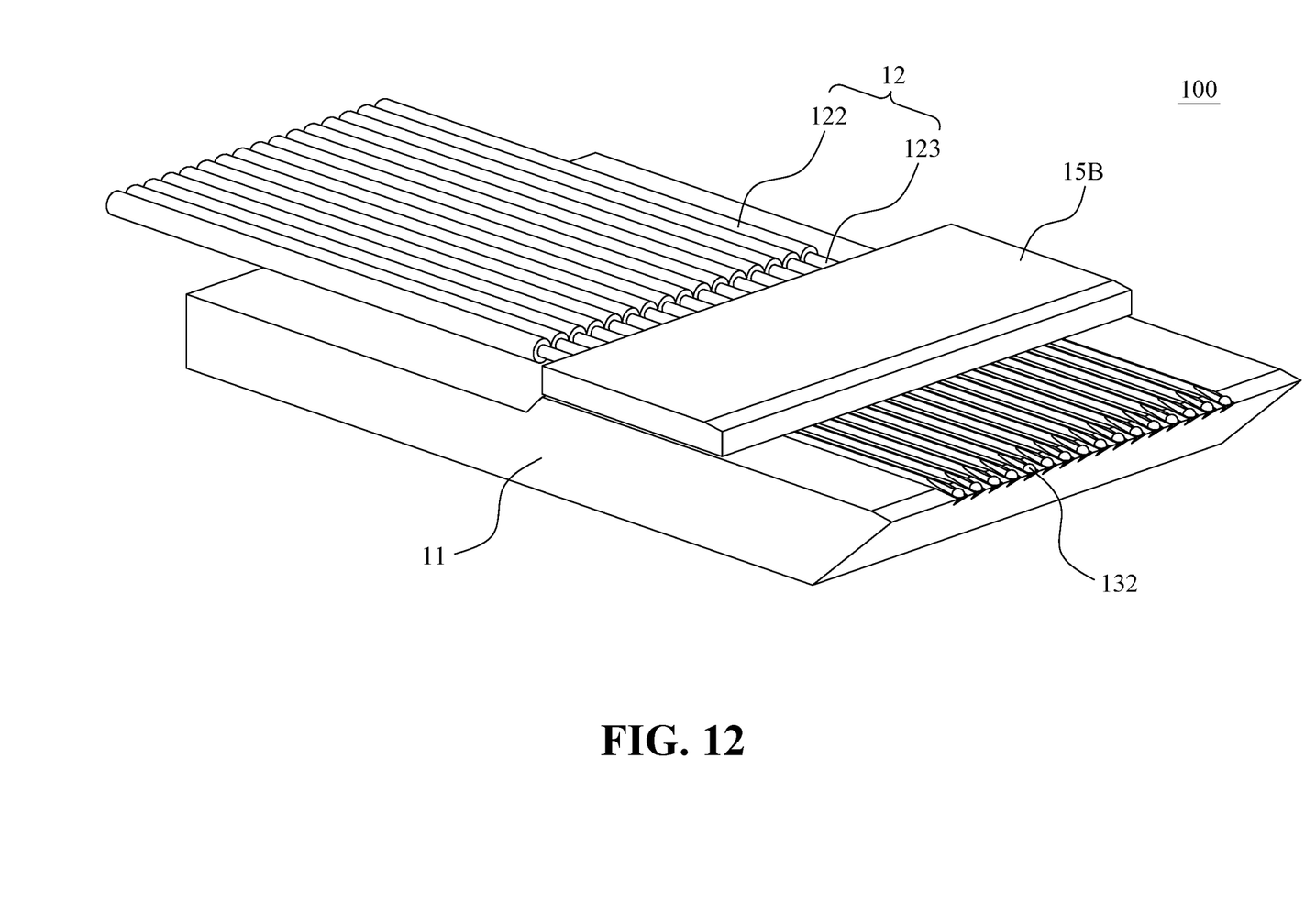
FIG. 12 is a schematic view of an optical probe for optoelectronic integrated circuits according to a sixth embodiment of the present invention.

FIG. 12 is a schematic view of an optical probe for optoelectronic integrated circuits according to a sixth embodiment of the present invention. Compared with the second embodiment, the optical probe 100 in the sixth embodiment of the present invention further includes a fixing cover 15B. The fixing cover 15B is disposed on the substrate 11, and the fixing cover 15B is used for fixing the optical fibers 12. The material and other characteristics used for the fixing cover 15B are similar to the fixed cover 15 and will not be described here.

It can be understood that those with ordinary knowledge in the technical field to which the present invention belongs can make various changes and adjustments based on the above examples, which will not be listed one by one here.

Thereby, the present invention has the following implementation effects and technical effects:

First, according to the optical probe 100 for optoelectronic integrated circuits of the present invention, the light exit end of the optical fiber 12 has a facet 121, and the facet 121 is disposed with a first angle θ1, so that the optical signal L transmitted by the optical fiber 12 is fully reflected. Thereby, an optical probe 100able to perform testing before wafer dicing and polishing is provided, so as to realize analyzing the component process yield at the earliest time to improve the process, reduce the extra production cost and product development cycle, and improve the detection accuracy and convenience of the end-face light coupling, achieving both wide applicability and high accuracy.

Second, in the optical probe 100 of the optoelectronic integrated circuit of the present invention, one end of the core portion 123 of the optical fiber 12 is disposed with a second angle θ2, so that when the optical signal L is transmitted to the facet 121, when the transmission direction is changed to enter the optical waveguide 22 of the optical chip 21, the risk of downward leakage of the optical signal L transmitted by the core portion 123 is reduced, and the reflection generated when the optical chip 21 is tested is prevented, thereby achieving the purpose of reducing light loss.

Third, the optical probe 100 of the optoelectronic integrated circuit of the first embodiment of the present invention, by disposing the lens layer 13 between the optical probe 100 and the plurality of optical waveguides 22, the plurality of first microlens 131 on the lens layer 13 can focus or collimate the optical signal L into the optical waveguide 22, thereby reducing coupling loss and reducing the transmission loss of the optical signal L between the optical fiber 12 and the optical waveguide 22.

Fourth, the optical probe 100 in the first embodiment of the present invention ensures the angle and position of the optical probe 100 when testing the optical chip 21 on the wafer 200 through the setting of the positioning block 14, and further ensures vertical coupling. Therefore, the coupling efficiency of the optical fiber 12 and the optical waveguide 22 is improved, the alignment accuracy is improved, and the allowable tolerance is reduced.

Fifth, in the optical probe 100 of the optoelectronic integrated circuit of the second embodiment of the present invention, the second microlens 132 is accurately disposed on each of the optical fibers 12 by means of three-dimensional printing, so as to avoid the use of the additional lens layer 13, and to achieve the effect of reducing the size and cost of the optical probe 100.

Sixth, the optical probe 100 for optoelectronic integrated circuits of the fourth embodiment of the present invention further fixes and stabilizes the optical fiber 12 within the v-groove 111 through the disposition of the v-groove 111 and the fixing cover 15 on the substrate 11; therefore, the stability of the optical probe 100 is improved, and a high-speed, effective and reliable detection scheme is realized.

The above is to illustrate the implementation of the present invention with specific embodiments, and those with ordinary knowledge in the art can easily understand other advantages and effects of the present invention from the content disclosed in this specification.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An optical probe for optoelectronic integrated circuits, applicable to a test environment for testing a plurality of optical chips on a wafer, and the optical chips having at least one optical waveguide, and the optical probe comprising:
    a substrate;
    a plurality of optical fibers, arranged on the substrate, the optical fibers being used for transmitting an optical signal transmitted in a first direction, and a light-emitting end of each of the optical fibers having a facet, and a first angle formed between the facet and the first direction; and
    at least one positioning block, disposed above the substrate in an area outside the optical fibers without overlapping the optical fibers for positioning the optical probe in a groove of the optical chips;
    wherein, the first angle causes the optical signal transmitted by the optical fibers to generate total reflection and output along a second direction, and the optical signal after total reflection enters the at least one optical waveguide of the optical chips, and the first angle is between 40 degrees and 45 degrees.

2. The optical probe according to claim 1, further comprising a lens layer, disposed on the optical fibers, the lens layer comprising a plurality of first microlenses, and each of the first microlenses corresponding to each of the optical fibers, the first microlenses focusing the optical signal after total reflection from the facet, so that the optical signal after total reflection is focused into the at least one optical waveguide of the optical chips through the first microlenses.

3. The optical probe according to claim 1, wherein the optical fibers comprise a film layer and a core portion, the film layer wraps around the core portion, and one end of the core portion forms a second angle with the first direction, the optical signal is transmitted inside the core portion, and the second angle is between 2 degrees and 10 degrees.

4. The optical probe according to claim 2, wherein the groove is a wafer dicing line, into which the optical probe is inserted along the first direction, so that the optical probe is coupled to the optical chips of the wafer.

5. The optical probe according to claim 2, wherein the at least one positioning block is disposed on the lens layer in the area outside the optical fibers and, has a shape matching the groove.

6. The optical probe according to claim 1, further comprising a plurality of microlenses, disposed on the optical fibers by means of three-dimensional printing, each of the microlenses corresponding to each of the optical fibers, the microlenses focusing the optical signal after total reflection from the facet, so that the optical signal after total reflection is focused into the at least one optical waveguide of the optical chips through the microlenses.

7. The optical probe according to claim 1, wherein the substrate comprises a plurality of v-grooves, and each of the optical fibers is correspondingly confined within each of the v-grooves.

8. The optical probe according to claim 7, further comprising a fixing cover, disposed on the substrate, and the fixing cover being used for fixing the optical fibers to be confined in the v-grooves.

* * * * *